United States Patent [19]

Acampora

[11] Patent Number: 4,524,423
[45] Date of Patent: Jun. 18, 1985

[54] DIGITAL SIGNAL SEPARATION FILTERS

[75] Inventor: Alfonse Acampora, Staten Island, N.Y.

[73] Assignee: RCA Corporation, Princeton, N.J.

[21] Appl. No.: 319,061

[22] Filed: Nov. 6, 1981

[51] Int. Cl.$^3$ ............................................. G06F 15/31
[52] U.S. Cl. ........................................ 364/724; 358/31
[58] Field of Search ................... 358/31, 21 R, 39, 40, 358/329; 364/724

[56] References Cited

U.S. PATENT DOCUMENTS

| | | | |
|---|---|---|---|
| 3,858,240 | 12/1974 | Golding et al. | 358/13 |
| 3,984,865 | 10/1976 | Avins | 358/36 |
| 4,041,531 | 8/1977 | Bingham | 358/37 |
| 4,179,705 | 12/1979 | Faroudja | 358/31 |
| 4,240,105 | 12/1980 | Faroudja | 358/31 |
| 4,430,721 | 2/1984 | Acampora | 364/724 |
| 4,466,016 | 8/1984 | Pritchard | 358/31 |

FOREIGN PATENT DOCUMENTS 1459465 12/1976 United Kingdom .
2022954 12/1979 United Kingdom .

OTHER PUBLICATIONS

"Digital Hierarchy Demonstration" by J. P. Rossi, presented at Feb., 1981 meeting of the SMPTE, pp. 6-4 through 6-11.

Primary Examiner—David H. Malzahn
Assistant Examiner—Oleg Schatoff
Attorney, Agent, or Firm—E. M. Whitacre; P. J. Rasmussen; E. P. Herrmann

[57] ABSTRACT

A digital finite impulse response (FIR) filter is provided in which a plurality of weighted signal taps are symmetrically located in time about a weighted center tap. Weighted signals from the symmetrically located taps are summed at a first point in the filter, which sum is then combined with signals from the center tap in one sense, that is, either additively or subtractively, to produce signals at a first output. The summed signals at the first point are also combined with signals from the center tap in an opposite sense to produce signals at a second output. The two outputs will exhibit bandpass and lowpass filter response characteristics, with the outputs at which the respective responses are produced being determined by the respective senses of signal combination. The FIR filter may be of either the input tap-weighted or output tap-weighted variety.

10 Claims, 7 Drawing Figures

DIGITAL SIGNAL SEPARATION FILTERS

This invention relates to digital signal separation filters, and, in particular, to digital filter networks which produce both a bandpassed digital signal and a lowpassed digital signal.

In television receivers in which the baseband video signal is processed in digital form, it is frequently desirable to separate signals which occupy contiguous bands of frequencies. For instance, when a video signal is comb filtered over the full video bandwidth to separate the interleaved luminance and chrominance signal components, some luminance information will be contained in the low-frequency portion of the signal produced at what is commonly termed the chrominance output of the comb filter. This luminance information, termed the vertical detail information, must then be separated from the higher frequency combed chrominance signal and recombined with the combed luminance signal to provide a fully restored luminance signal. In the NTSC television system, the chrominance signal extends down to about 1.5 MHz below the color subcarrier frequency of 3.58 MHz, and the vertical detail information is contained in the lower 1.0 MHz of the signal produced at the chrominance output of the comb filter. The luminance and chrominance signal components of the output signal of the chrominance channel may be separated between the upper frequency of the vertical detail signal, 1.0 MHz, and the lower frequency of the chrominance signal of approximately 2.1 MHz.

An arrangement for separating the vertical detail information and the chrominance information at the output of the chrominance comb filter is shown in U.S. Pat. No. 4,096,516. In that arrangement, the video signal is comb filtered by a sampled data system comprising a charge coupled device (CCD) comb filter. The combed chrominance signal at the output of the chrominance comb filter is separated by two filters, each including lumped frequency selective filter elements. A lowpass filter having a passband of 0 to 1.5 MHz separates the vertical detail information from the chrominance information, and couples the vertical detail information to the luminance signal at the output of the luminance comb filter. A bandpass filter couples bandpassed chrominance signals from the output of the chrominance comb filter to a chrominance signal processor.

In a digital television receiver, in which the luminance and chrominance signals are separated by a digital comb filter, it is likewise desirable to separate the vertical detail information from the chrominance information for recombination with the combed luminance signal when the video signal is comb filtered over the full band of video frequencies. In order to minimize the number of circuit elements required to perform the separation, it is desirable to use a single filter having a lowpass filter output for the vertical detail information and a bandpass filter output for the chrominance signal.

In accordance with the principles of the present invention, a digital finite impulse response (FIR) filter is provided in which a plurality of weighted signal taps are symmetrically located in time about a weighted center tap. Weighted signals from the symmetrically located taps are summed at a first point in the filter, which sum is then combined with weighted signals from the center tap in one sense, that is, either additively or subtractively, to produce signals at a first output. The summed signals at the first point are also combined with weighted signals from the center tap in an opposite sense to produce signals at a second output. The two outputs will exhibit bandpass and lowpass filter response characteristics, with the outputs at which the respective responses are produced being determined by the respective senses of signal combination.

In a first embodiment, an output tap weighted FIR filter is constructed in accordance with the principles of the present invention to provide both a bandpassed output signal and a lowpassed output signal. In a second embodiment, an input tap weighted FIR filter is arranged in accordance with the principles of the present invention to provide the filtered output signals.

Figure 1:
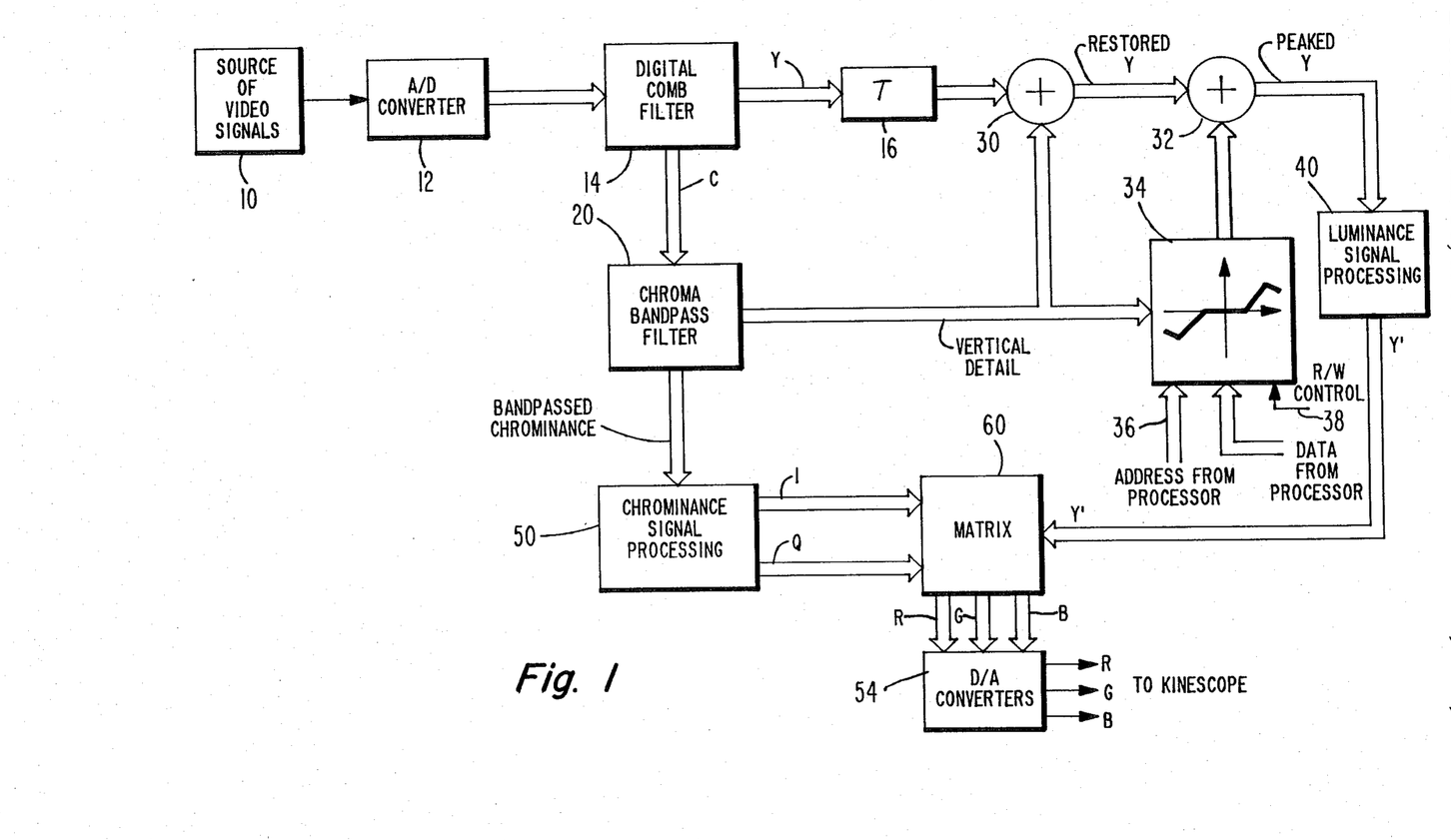
FIG. 1 illustrates, in block diagram form, the baseband digital signal processing section of a television receiver, constructed in accordance with the principles of the present invention.

Referring to FIG. 1, the baseband digital signal processing section of a television receiver, constructed in accordance with the principles of the present invention, is illustrated in block diagram form. Video signals are supplied from a source of video signals 10 which may comprise, for instance, a video detector in a television receiver. The video signals are applied to an analog to digital converter 12, which converts the analog video signals to digital signals in the form of successive eight-bit words, for instance. The digital signals are applied to the input of a digital comb filter 14, which separates the signals into separate luminance (Y) and chrominance (C) components. The digital comb filter 14 may be constructed to operate as described in the article "Digital Television Image Enhancement" by John P. Rossi, 84 SMPTE at 545-51 (1974). The separated Y signal is applied by way of a delay element 16 to an input of an adder 30. The delay τ of the delay element 16 is chosen to substantially match the delay encountered by a vertical detail signal as it is processed by a combination bandpass and lowpass filter network 20, which is coupled between the C output of the comb filter 14 and a second input of adder 30. The adder 30 combines the vertical detail signal with the combed luminance signal to produce a restored luminance signal. The restored Y signal is applied to one input of an adder 32, where a vertical peaking signal component is added to the restored Y signal. The resulting peaked Y signal is applied to luminance signal processing circuitry 40, which may be controlled to modify the brightness and contrast of the luminance signal. The processed luminance signal Y' at the output of processing circuitry 40 is applied to an input of a matrix 60.

The bandpass/lowpass filter network 20, constructed in accordance with the principles of the present invention, is coupled to the chrominance output C of the comb filter 14. The bandpass/lowpass filter 20 produces a bandpassed chrominance signal at one output which is applied to the input of chrominance signal processing circuitry 50. The bandpass/lowpass filter 20 also produces a lowpass filtered vertical detail signal at a second output, which is applied to the adder 30, and to the input of a nonlinear detail signal processor 34. The nonlinear processor 34 exhibits a nonlinear transfer function as shown in FIG. 1 and described on pages 12–15 of the article "A CCD Comb Filter for Color TV Receiver Picture Enhancement" by D. H. Pritchard, and published in Volume 41 of the RCA review at pages 3, et. seq. (March, 1980). The nonlinear processor 34 operates to core low amplitude signals, to peak intermediate amplitude signals, and to pare, or attenuate, high amplitude signals. The nonlinear processor 34 may comprise, for example, a random access memory (RAM), with the transfer function applied to the vertical detail information being a function of data stored in the RAM under control of a processor (not shown). New data may be stored in the RAM by processor control of a read/write control line 38 and RAM address lines 36 during inactive video intervals, such as the vertical blanking interval. The processed vertical detail signal is applied to the adder 32 as a peaking signal.

The chrominance signal processing circuitry 50 may comprise a chroma peaker and a color mixture signal demodulator, as described in U.S. patent application Ser. No. 297,556, entitled "DIGITAL COLOR TELEVISION SIGNAL DEMODULATOR", filed Aug. 31, 1981. The chrominance signal processing circuitry 50 produces demodulated color mixture signals, such as color difference signals (B-Y) and (R-Y) or I and Q signals. The color mixture signals are applied to the matrix 60. The matrix 60 combines the color mixture and luminance signals to produce red, green and blue color signals, which are then converted to analog form by a digital to analog converter 54 for application to a television kinescope (not shown).

In the arrangement of FIG. 1, the bandpass/lowpass filter network 20 serves to separate the vertical detail information, contained in the low frequency portion of the signal produced by the chrominance comb filter, from the chrominance information contained in the high frequency portion of the signal produced by the chrominance comb filter. The filter network 20 produces bandpass filtered chrominance signals, free of luminance signal components, for application to the chrominance signal processing circuitry. The filter network 20 also produces, at a separate output, lowpass filtered vertical detail information for the luminance channel, free of chrominance signal residue which could create "dot crawl" on edges of the restored luminance signal.

Figure 2:
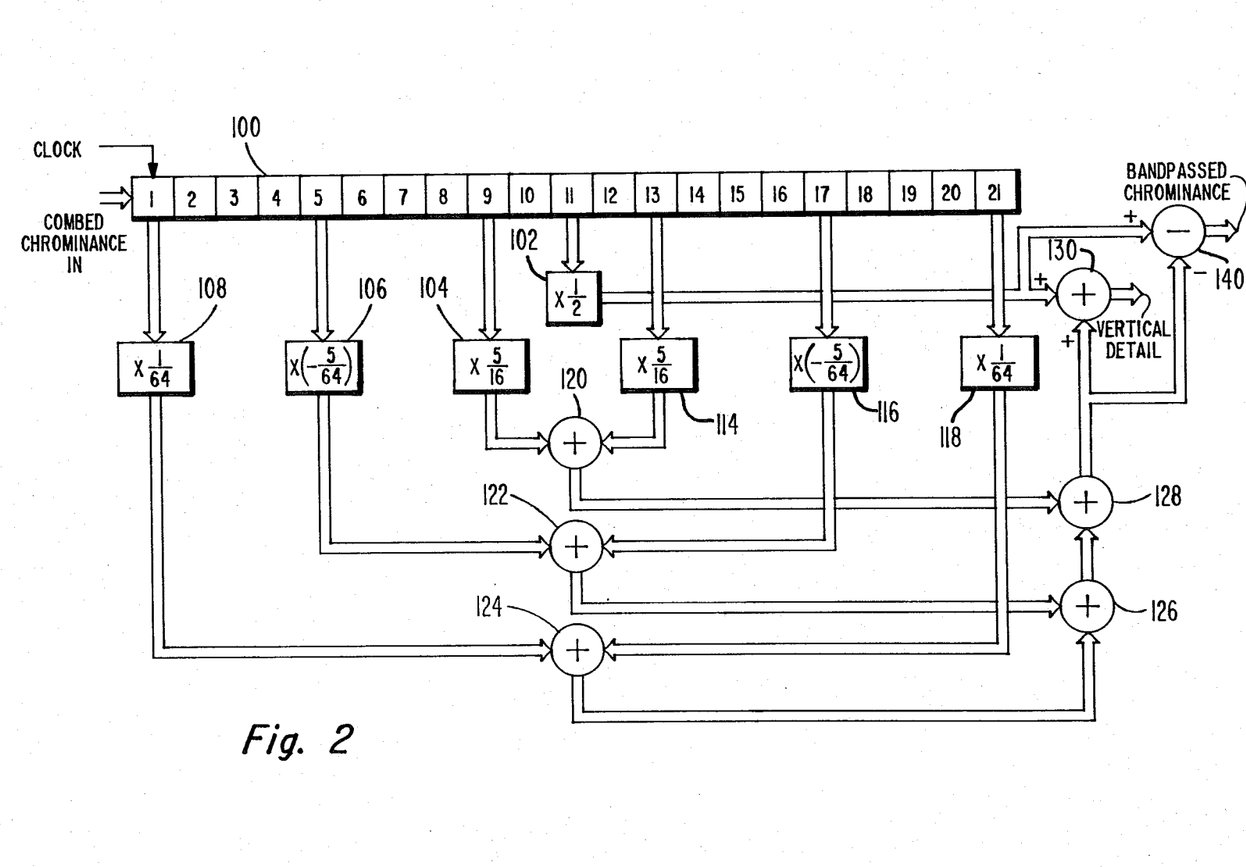
FIG. 2 illustrates, in block diagram form, an output tapped FIR filter constructed in accordance with the principles of the present invention.

A bandpass/lowpass filter network, suitable for use in the arrangement of FIG. 1 and constructed in accordance with the principles of the present invention, is shown in FIG. 2. The network of FIG. 2 comprises a digital FIR filter, including a tapped shift register 100, weighting function circuits 102–118, and an adder tree arrangement 120–140. In this and subsequent embodiments of the present invention, the broad arrows shown in the drawing figures represent parallel lines of digital information which couple digital words of a plurality of bits from one element to another.

In FIG. 2, combed chrominance signals in the form of, for example, eight-bit words, are applied to the first stage of shift register 100. Each stage of the shift register 100 is capable of temporarily storing and transferring a word of the chrominance signal under control of a clock signal. Thus, each stage of the shift register 100, numbered one through twenty-one can simultaneously hold eight bits. The shift register 100 exhibits a delay from the input of the first stage to the output of the last stage which is a function of the number of stages and the frequency of the clock signal which shifts the signals through the register. The arrangement of FIG. 2 therefore comprises a 21-order FIR filter with taps being coupled to the outputs of stages one, five, nine, eleven, thirteen, seventeen and twenty-one.

The weighting function circuits 102–118 are coupled to the output taps of shift register 100 and multiply the tapped signals by the fractional coefficients shown in the FIGURE. The FIR filter exhibits an impulse response which is relatively concentrated and symmetrical about the tapped center stage eleven. Signals from stage eleven are weighted by one-half in this example by weighting function circuit 102 and the tap-weighted signals are then applied to an input of an adder 130, and to an input of a subtractor 140. Signals from stages nine and thirteen, both located two stages away from the center stage eleven, are weighted by the coefficient +(5/16) by weighting function circuits 104 and 114, and applied to inputs of adder 120. Signals from stages five and seventeen, both located six stages away from the center stage, are weighted by the coeffiecint −(5/64) by weighting function circuits 106 and 116, and applied to inputs of an adder 122. Signals from stages one and twenty-one, both located ten stages away from the center stage, are weighted by the coefficient +(1/64) by weighting function circuits 108 and 118, and applied to inputs of an adder 124. The symmetrical distribution of tapped stages one, five and nine, and thirteen, seventeen and twenty-one and the symmetrical weighted values of this distribution about the center stage eleven give the FIR filter a linear phase characteristic.

The outputs of adders 122 and 124 are coupled to inputs of an adder 126, which combines the applied signals and has an output coupled to an input of an adder 128. Adder 128 combines signals produced by adder 126 with signals provided by adder 120, and has its output coupled to an input of adder 130. Adder 130 combines the tap-weighted signals summed in adder 128 with the center tap-weighted signal, and exhibits a lowpass filter response characteristic at its output. Lowpass filtered vertical detail signals are thus produced at the output of adder 130.

The combined tap-weighted signals at the output of adder 128 are also applied to an input of subtractor 140, where they are subtractively combined with the weighted center tap signals. Subtractor 140 thereby exhibits a bandpass filter response characteristic at its output, which is a complement of the response characteristic at the output of adder 130. Bandpass filtered chrominance signals are produced at the output of subtractor 140. Thus, a single filter is used to provide both lowpass filtering and bandpass filtering.

Figure 3:
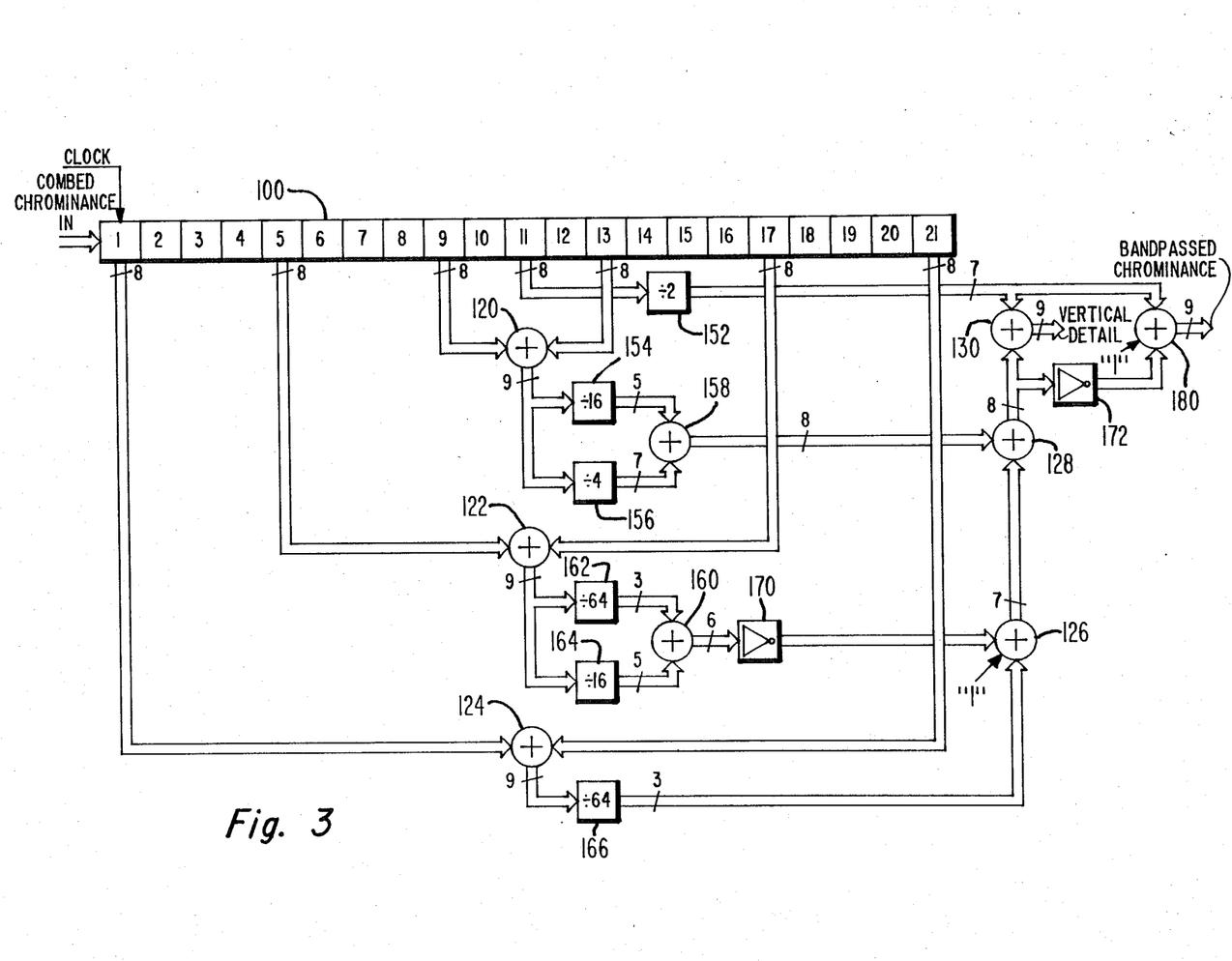
FIG. 3 illustrates, in block diagram form, a more detailed representation of the FIR filter of FIG. 2.

A more detailed embodiment of the FIR filter of FIG. 2 is illustratively shown in FIG. 3. Since the weighting function coefficients of FIG. 2 all have denominators which are powers of two, the tapped signals may be weighted by a shift-and-add technique, as shown in FIG. 3, which obviates the need for coefficient multipliers. For example, because signals from shift register stages nine and thirteen are both weighted by the same coefficient value of (5/16), these two signals may be added in adder 120 before weighting, as shown in FIG. 3. If, as in this example, the tapped signals are each eight bits in length, the output of adder 120 will be a nine-bit word. The nine-bit output of adder 120 is divided by sixteen, as indicated by clock 154, and by four, as indicated by block 156, in the coupling of adder 120 to the inputs of an adder 158. The nine-bit output of adder 120 is divided by sixteen by coupling only the five most significant bits of the output to the low-order bit inputs of one input of adder 158, and is divided by four by coupling the seven most significant bits to the lower order bit inputs of a second input of adder 158. Adder 158 adds these two words to produce an eight-bit output signal, which is the sum of (1/16) plus (¼), or (5/16) of the values of the tapped signals. This is the desired weighting coefficient for signals tapped from stages nine and thirteen.

In a similar manner, signals tapped from shift register stages five and seventeen are summed in adder 122, which produces a nine-bit output signal. The output of adder 122 is divided by sixty-four and by sixteen in its coupling to the two inputs of an adder 160, as indicated by blocks 162 and 164. Adder 160 produces a six-bit output signal which is weighted by (5/64) with respect to the tapped signals. This output signal is inverted by an inverting circuit 170 and applied to an input of adder 126, together with a logical "1" carry-in bit. The signal inversion and the carry-in bit perform a two's complementing of the output of adder 160, which effectively provides the minus sign for the weighting coefficient.

Signals tapped from shift register stages one and twenty-one are summed in adder 124, the output of which is divided by sixty-four by coupling the three most significant output bits of adder 124 to the second input of adder 126, as indicated by block 166. The output of adder 126 is coupled to one input of adder 128, and the output of adder 158 is coupled to a second input of adder 128. Adder 128 produces an output signal which is the sum of weighted signals from all of the shift register taps except the center tap eleven.

The output of adder 128 is coupled to one input of adder 130. The seven most significant bits of the signal tapped from center stage eleven are coupled to the second input of adder 130, as connoted by block 152. Adder 130 thereby exhibits a lowpass filter characteristic at its output, at which the vertical detail information of the input signal is produced.

The seven most significant bits of the signal tapped from center stage eleven are coupled to one input of an adder 180. The output of adder 128 is coupled to a second input of adder 180 by an inverting circuit 172, together with a logical "1" carry-in bit. The inversion of the output signal of adder 128 along with the carry-in bit provide a two's complementing of the output signal of adder 128. This causes the output signal of adder 128 to be subtracted from the weighted center tap signal in adder 180, causing adder 180 to exhibit a bandpass filter response characteristic at its output. Bandpass filtered chrominance information is thereby produced at its output.

Figure 5:
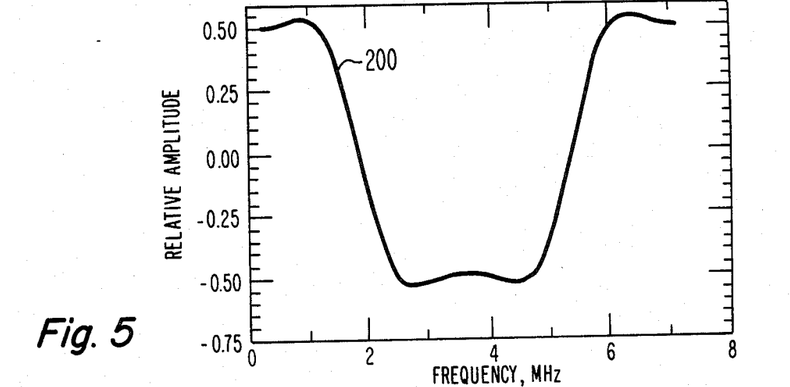
FIGS. 5, 6 and 7 illustrate response characteristic curves used to explain the operation of the embodiments of FIGS. 1 through 4.
Figure 6:
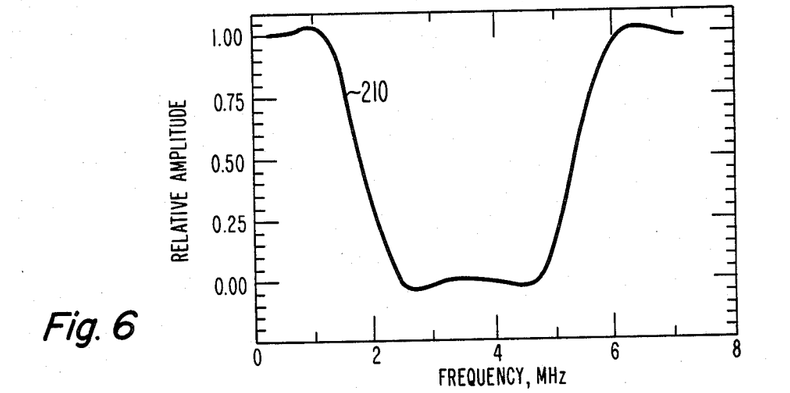
Figure 7:
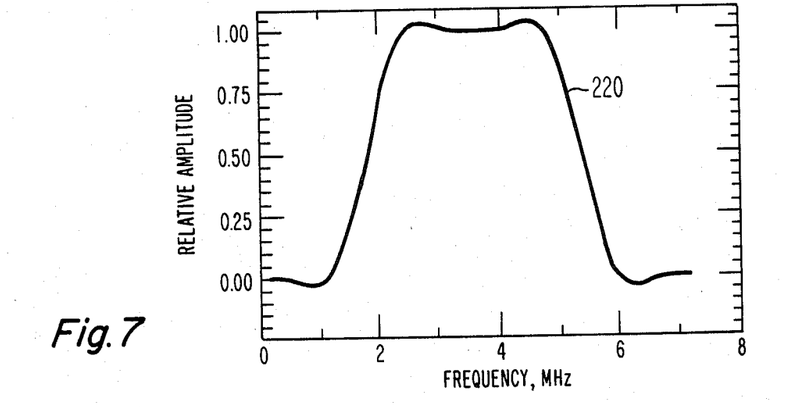

The operation of the embodiments of FIGS. 2 and 3 may be appreciated by referring to the response characteristic curves of FIGS. 5, 6 and 7. FIG. 5 illustrates the response characteristic 200 exhibited at the output of adder 128, when the shift register 100 is clocked by a 14.32 MHz signal. This response characteristic 200 is seen to have substantially equal amplitude variations about a midpoint value of 0.00.

When weighted signals from the center tapped stage eleven are additively combined with signals produced by adder 128 in adder 130, a response characteristic as shown in FIG. 6 results at the output of adder 130. This is because the center tap eleven exhibits a flat amplitude versus frequency response which has a constant amplitude of one-half relative to the peak-to-peak amplitude of the curve 200 of FIG. 5. The one-half amplitude value results from the value of the center tap weighting coefficient of one-half. Adder 130 thus effectively combines response curve 200 with a flat response characteristic of substantially one-half its relative amplitude, thereby raising the response curve 200 by one-half with respect to the relative amplitude scale shown at the ordinate of FIG. 5. The result is response curve 210 of FIG. 6, in which the 0.00 value is now located at the bottom of the response curve. Response curve 210 thus defines a lowpass filter response from zero Hz. to a six dB point at about 1.8 MHz, and a highpass filter above approximately 5.2 MHz, with a stopband interposed in the intermediate frequency range. However, since the video frequency range in the NTSC television system extends to only about 4.2 MHz, the highpass portion of the response contains essentially no signal content in the television receiver. The lowpass filter portion, then defines a passband for lowpass filtered vertical detail information signals at the output of adder 130.

When the output signals of adder 128 are two's complemented for combination with the center tap weighted signals in adder 180 (or subtractor 140), the response characteristic 200 of FIG. 5 is essentially inverted about the median 0.00 value. The combination of the tapped signals from the center stage, weighted by one-half, effectively relocates the 0.00 scale value at the bottom of the inverted response characteristic, as shown by response characteristic 220 of FIG. 7. Response characteristic 220 is seen to define a bandpass filter characteristic with a passband between approximately 1.8 MHz and 5.2 MHz. Since the chrominance passband terminates at approximately 4.1 MHz, adder 180 (or subtractor 140) will pass the chrominance signal of a television receiver in the passband of approximately 1.8 to 4.1 MHz.

Figure 4:
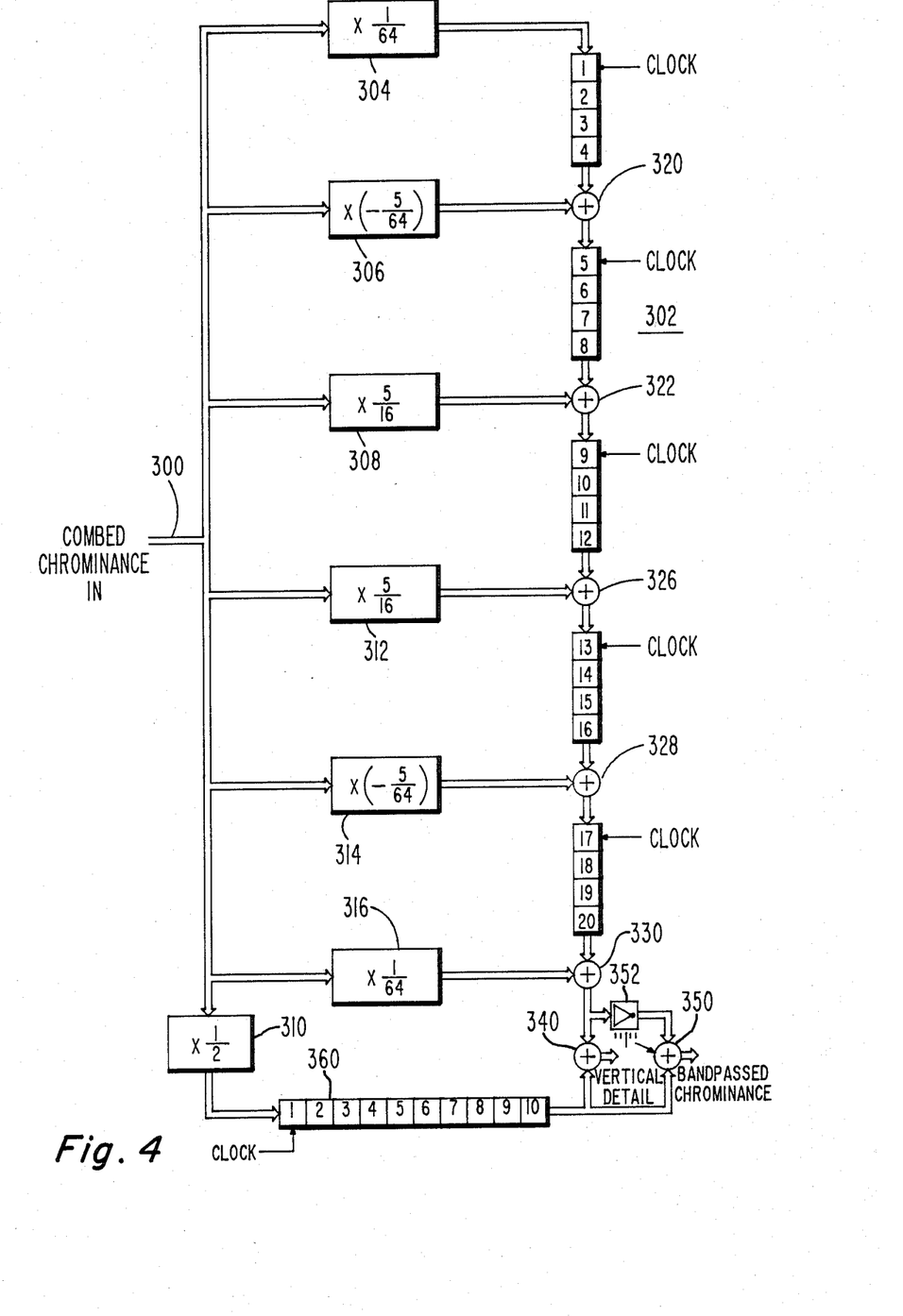
FIG. 4 illustrates, in block diagram form, an input tap weighted FIR filter constructed in accordance with the principles of the present invention.

The bandpass/lowpass filter network of the present invention may be configured as an input tapped FIR filter, as shown in the arrangement of FIG. 4. In this embodiment a twenty-stage shift register 302 is used in the FIR filter, with adders 320–328 inserted between four-stage segments of the shift register. Weighted input signals from the combed chrominance signal applied to the filter input 300 are applied to the input of the first stage of the shift register 302 and to the intervening adders. The shift register stages are clocked by a common clock signal.

The combed chrominance input signal is applied to the input of the first stage and to an input of an adder 330 by weighting function circuits 304 and 316, which weight the applied signals by +(1/64). Adder 330 has a second input coupled to the output of the last shift register stage twenty. The input signal is applied to an input of an adder 320, which is coupled between shift register stages four and five, by a weighting function circuit 306. The input signal is applied to an input of an adder 328, which is coupled between shift register stages sixteen and seventeen, by a weighting function circuit 314. Weighting function circuits 306 and 314 weight the input signals by a factor of −(5/64). The input signal is weighted by a factor of +(5/16) by weighting function circuits 308 and 312, which are coupled to inputs of adders 322 and 326. Adder 322 is coupled between shift register stages eight and nine, and adder 326 is coupled between shift register stages twelve and thirteen.

The impulse response of the FIR filter of FIG. 4 is concentrated around the junction of shift register stages ten and eleven, which is located equidistantly between the first and last stages. Weighted signal components are accumulated in the adders as they pass through the shift register and adders, with the response characteristic of FIG. 5 being exhibited at the output of adder 330. Signals at the output of adder 330 are applied to an input of an adder 340 for combination with signals provided by a shift register 360. The shift register 360 receives input signals which have been weighted by one-half by weighting function circuit 310, and delays these signals by the same amount of delay time as exhibited by the FIR filter from its impulse response center at the output of stage ten to the output of adder 330. Signals at the output of shift register 360 thus correspond to the center tap weighted signals of the embodiments of FIGS. 2 and 3. Therefore, adder 340 will exhibit the lowpass filter response characteristic of FIG. 6 at its output, at which the vertical detail information signals are provided.

Signals developed at the output of adder 330 are two's complemented for subtractive combination with signals provided by a shift register 360 in an adder 350. The output of adder 330 is coupled to an input of adder 350 by an inverting circuit 352, with the adder 350 also receiving a logical "1" carry-in bit. Adder 350 thus exhibits the bandpass filter response characteristic of FIG. 7 at its output by reason of the sutractive combination of signals supplied by shift register 360 and adder 330.

The FIR filter embodiments of the present invention have complementary forms, which may be obtained by selective reversal of the signs of the weighting coefficients, and/or reversal of the senses of the signal combining elements which produce the output signals. For example, if the signs of the weighting function coefficients of circuits 104, 106, 108 and 114, 116, 118 of FIG. 2 are all reversed, adder 130 will exhibit the bandpass response characteristic and subtractor 140 will exhibit the lowpass response characteristic. If, in addition, the senses of adder 130 and subtractor 140 are changed so that adder 130 becomes a subtractor and subtractor 140 becomes an adder, the new adder 140 will exhibit a bandpass response and the new subtractor 130 will exhibit a lowpass response. However, signals passed by the new subtractor 130 will now exhibit a phase reversal with respect to the input signals of the filter. As another example, if the embodiment of FIG. 2 is changed so that substractor 140 subtracts the weighted center tap signal from the signals produced by adder 128, instead of the opposite as shown in the FIGURE, subtractor 140 will exhibit a bandpass response with a phase reversal of the passed signals with respect to the filter input signal. These alternate filter forms, in which signals at one or even both of the outputs exhibit a phase reversal, may be desirable when one of the subsequent signal processing stages requires phase-inverted input signals. Analysis has shown that at least twelve such complementary filter forms may be obtained for each of the illustrated embodiments.

It may be appreciated that the bandpass/lowpass filter networks of the present invention have application in television receivers in which the luminance and chrominance information is not separated by comb filtering. Luminance and chrominance signals can then be separated directly by the bandpass lowpass filter. In such a receiver, the values of the weighting function coefficients or the clock frequency can be adjusted to relocate the crossover frequencies (transition bands) of the output response characteristics at a higher frequency. In the NTSC television system, this crossover frequency would be approximately 3.2 MHz. The lowpass filter output in such an arrangement would pass signals up to approximately 3.2 MHz, and the bandpass filter output would provide signals of frequencies from 3.2 MHz to the upper limit of the video frequency range. When the digital video signal from the A/D converter is supplied to the input of the filter, luminance information signals would be produced at the output exhibiting the lowpass filter response, and chrominance information signals would be produced at the output exhibiting the bandpass filter response.

What is claimed is:

1. A digital filter for separating signals occupying separate frequency portions of a contiguous range of input signal frequencies, comprising:

a source of input signal;

delaying means, including a shift register coupled to said source and having a plurality of signal tapes including a center tap;

respective signal weighting means, coupled to ones of said signal taps, including a center tap weighting means for weighting signals occurring at said taps;

means, coupled to said signal weighting means, excluding said center tap weighting means for producing at a first output port a singal which is a sum of tap-weighted signals;

first signal combining means having a first input coupled to receive said sum of tap-weighted signals and a second input coupled to said center tap weighting means for combining applied signals in a first sense to produce output signals occuping a relatively high frequency portion of said contiguous frequency range; and second signal combining means having a first input coupled to receive said sum of tap-weighted signals and a second input coupled to said center tap weighting means for combining applied signals in a second sense to produce output signals occupying a relatively low frequency portion of said contiguous frequency range, wherein the frequency responses of said first and second signal combining means are complementary transfer functions.

2. A digital filter, responsive to a comb filtered chrominance input signal for producing first and second output signals at outputs exhibiting complementary frequency response characteristics, comprising:

a shift register coupled to receive an input signal and having a plurality of output taps including an intermediate output tap;

means coupled to said plurality of taps excluding the intermediate output tap, and having an output, for weighting and combining signals developed at said plurality of taps;

signal weighting means coupled to said intermediate output tap;

first signal combining means coupled to said intermediate output tap signal weighting means and to said weighting and combining means, for combining applied signals in a first sense, and producing an output signal including a range of frequencies occupied by chrominance signal; and second signal combining means coupled to said intermediate output tap signal weighting means and to said weighting and combining means, for combining applied signals in a second sense, and producing an output signal excluding said range of frequencies occupied by the chrominance signal.

3. The arrangement of claim 2, wherein said plurality of output taps of said shift register is symmetrically located with respect to said intermediate output tap; and wherein said weighting and combining means includes a plurality of weighting function circuits coupled to ones of said plurality of output taps and exhibiting symmetrical weighting function values about said intermediate output tap, and an adder tree coupled to said weighting function circuits and having an output corresponding to the output of said weighting and combining means at which a tap-weighted signal is produced.

4. The arrangement of claim 3, wherein said first signal combining means comprises an additive signal combiner for additively combining signals produced at said output of said adder tree with tap-weighted signals derived from said intermediate tap; and said second signal combining means comprises a subtractive signal combiner for subtractively combining signals produced at said output of said adder tree with tap-weighted signals derived from said intermediate tap.

5. A digital filter, responsive to an input signal for producing first and second output signals at outputs exhibiting different response characteristics comprising:
a source of input signal;
a shift register including a plurality of serially coupled stages and having a plurality of adders coupled between ones of said stages, said adders having respective first input ports coupled respectively to immediately preceding shift register stages, having respective second input ports and having respective output ports respectively coupled to immediately succeeding register stages; said shift register having an input port and an output port at the firstmost and lastmost of said serially coupled stages respectively;

respective means, responsive to said input signal, for applying weighting signals to respective second input ports of ones of said adders and said shift register input port;
means, responsive to said input signal for producing signals at an output which are delayed by at least half the delay of said shift register;
first signal combining means, coupled to said output of said shift register and to said signal delaying means, for combining signals applied thereto in a first sense to produce an output signal exhibiting a first amplitude versus frequency response characteristic; and
second signal combining means, coupled to said output of said shift register and to said signal delaying means, for combining signals applied thereto in a second sense to produce a second output signal exhibiting a second amplitude versus frequency response characteristic.

6. The arrangement of claim 5, wherein said weighted signal applying means comprises a plurality of weighting function circuits having symmetrical weighting function values with respect to an intermediate point of said shift register, and wherein said plurality of adders are symmetrically located about said intermediate point of said shift register.

7. The arrangement of claim 6, wherein said signal delaying means includes the series combination of a weighting function circuit and a second shift register having half the number of stages as said first-named shift register.

8. The arrangement of claim 7 wherein said first signal combining means comprises an additive signal combiner for additively combining signals produced by said signal delaying means and said first-named shift resister; and
said second signal combining means comprises a subtractive signal combiner for subtractively combining signals produced by said signal delaying means and said first-named shift resister.

9. The arrangement of claims 4 or 8, wherein said subtractive signal combiner includes means for two's complementing one of said applied signals, and an adder.

10. The arrangement of claim 3 or 6 wherein said weighting function circuits comprise shift-and-add circuits.

* * * * *

UNITED STATES PATENT AND TRADEMARK OFFICE
CERTIFICATE OF CORRECTION

PATENT NO. : 4,524,423

DATED : June 18, 1985

INVENTOR(S) : Alfonse Acampora

It is certified that error appears in the above-identified patent and that said Letters Patent is hereby corrected as shown below:

Column 3, lines 25 & 26 should read as follows:

"demodulator, as described in U.S. patent No. 4,415,918, entitled "DIGITAL COLOR TELE-".

Column 8, line 25    "tapes" should be --taps--.

Column 8, line 32    "singal" should be --signal--.

Signed and Sealed this

Twenty-ninth Day of October 1985

[SEAL]

Attest:

Attesting Officer

DONALD J. QUIGG

Commissioner of Patents and Trademarks—Designate